United States Patent
Gonzalez et al.

(10) Patent No.: US 7,323,360 B2
(45) Date of Patent: Jan. 29, 2008

(54) ELECTRONIC ASSEMBLIES WITH FILLED NO-FLOW UNDERFILL

(75) Inventors: Carlos A. Gonzalez, Chandler, AZ (US); Song-Hua Shi, Phoenix, AZ (US); Milan Djukic, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/003,238

(22) Filed: Oct. 26, 2001

(65) Prior Publication Data
US 2003/0080437 A1    May 1, 2003

(51) Int. Cl.
*H01L 21/00* (2006.01)
*H01L 21/44* (2006.01)
*H01L 29/40* (2006.01)

(52) U.S. Cl. ............... 438/108; 438/106; 438/612; 438/613; 257/737; 257/738; 257/777; 257/778

(58) Field of Classification Search ........ 438/108, 438/112, 106, 124, 126, 127, FOR. 384; 257/778, 787, 779
See application file for complete search history.

(56) References Cited

U.S. PATENT DOCUMENTS

| | | | |
|---|---|---|---|
| 5,128,746 A | 7/1992 | Pennisi et al. | 357/72 |
| 5,973,403 A | 10/1999 | Wark | |
| 5,975,408 A * | 11/1999 | Goossen | 228/173.2 |
| 6,121,689 A | 9/2000 | Capote et al. | |
| 6,132,646 A | 10/2000 | Zhou et al. | 252/512 |
| 6,168,972 B1 | 1/2001 | Wang | |
| 6,180,696 B1 * | 1/2001 | Wong et al. | 523/456 |
| 6,189,208 B1 * | 2/2001 | Estes et al. | 29/840 |
| 6,229,220 B1 * | 5/2001 | Saitoh et al. | 257/738 |
| 6,297,560 B1 | 10/2001 | Capote et al. | |
| 6,373,142 B1 * | 4/2002 | Hoang | 257/783 |
| 6,434,817 B1 * | 8/2002 | Feigenbaum et al. | 29/840 |
| 6,564,988 B1 * | 5/2003 | Shiraishi et al. | 228/110.1 |
| 6,660,560 B2 * | 12/2003 | Chaudhuri et al. | 438/108 |
| 6,680,436 B2 * | 1/2004 | Xu et al. | 174/52.2 |
| 6,746,896 B1 * | 6/2004 | Shi et al. | 438/108 |
| 2001/0003058 A1 * | 6/2001 | Gilleo et al. | 438/612 |

(Continued)

FOREIGN PATENT DOCUMENTS

| | | |
|---|---|---|
| EP | 0878839 | 11/1998 |
| JP | RD291011 | * 7/1988 |

*Primary Examiner*—Michael Lebentritt
*Assistant Examiner*—James M Mitchell
(74) *Attorney, Agent, or Firm*—Schwegman, Lundberg & Woessner, P.A.

(57) ABSTRACT

High yield, high reliability, flip-chip integrated circuit (IC) packages are achieved utilizing a combination of heat and pressure to bond flip-chip die and to cure no-flow underfill material. The underfill comprises a filler or low coefficient of thermal expansion (CTE) material to decrease CTE of the cured underfill. The filler material can be selected from the group comprising silica, silicon oxide, silicon dioxide, silicon nitride, aluminum oxide, aluminum nitride, or a mixture thereof. The filler material may also increase the viscosity of the uncured underfill and/or increase the modulus of elasticity of the cured underfill. In some method embodiments, a thermocompression bonder is used to simultaneously provide solder bump reflow and underfill curing. Application of various methods to a component package, an electronic assembly, and an electronic system are also described.

10 Claims, 7 Drawing Sheets

U.S. PATENT DOCUMENTS

| | | | |
|---|---|---|---|
| 2001/0053448 A1* | 12/2001 | Satsu et al. | 428/447 |
| 2002/0032280 A1* | 3/2002 | Charles et al. | 525/107 |
| 2002/0106515 A1* | 8/2002 | Carpenter et al. | 428/413 |
| 2002/0110956 A1* | 8/2002 | Kumamoto et al. | 438/108 |
| 2002/0128354 A1* | 9/2002 | Garrett | 523/463 |

* cited by examiner

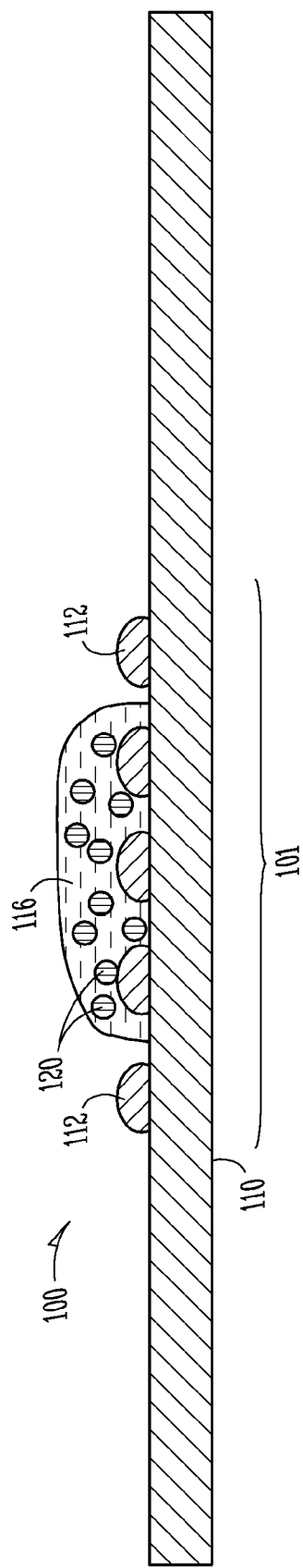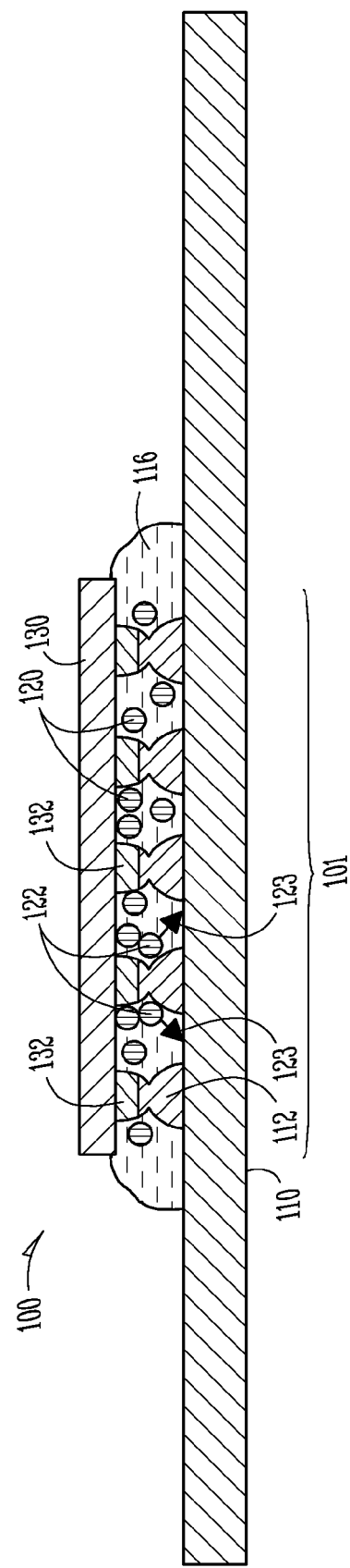

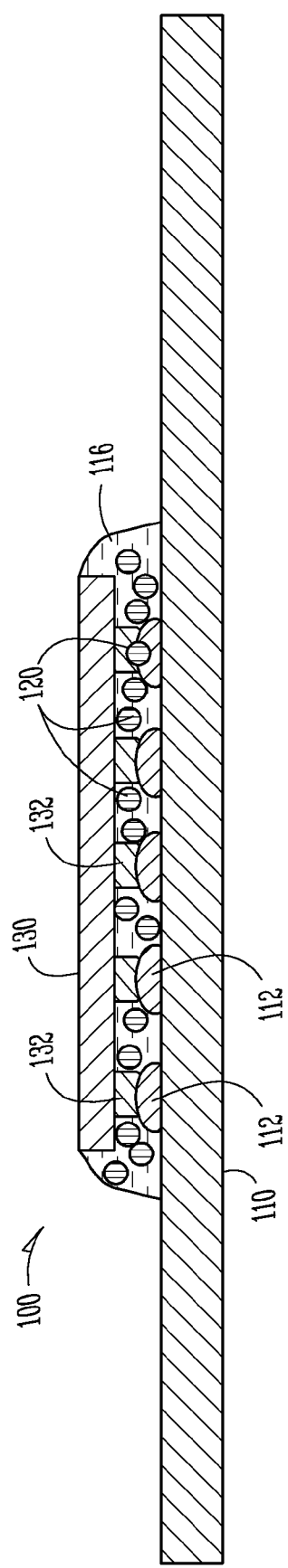

ELECTRONIC ASSEMBLIES WITH FILLED NO-FLOW UNDERFILL

TECHNICAL FIELD

The present subject matter relates generally to electronics packaging. More particularly, the present subject matter relates to an electronic assembly that includes a component package, such as an integrated circuit (IC) package, comprising a filled no-flow underfill material to increase yield and reliability, and to manufacturing methods related thereto.

BACKGROUND INFORMATION

Electronic components, such as integrated circuits (ICs), are typically assembled into component packages by physically and electrically coupling them to a substrate made of organic or ceramic material. One or more component packages, such as IC packages, can be physically and electrically coupled to a printed circuit board (PCB) to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of ICs, where each new generation of IC packaging must provide increased performance, while maintaining good yield and reliability.

A high performance IC typically has a relatively large number of input/output (I/O), power, and ground terminals (also called "bumps" herein). An IC package substrate has a number of metal layers selectively patterned to provide metal interconnect lines (also called "traces" herein), and a relatively large number of terminals (also called "pads" herein) to which the terminals of an IC can be suitably connected, for example, using solder.

To enhance the reliability of the solder joints connecting the IC bumps and the IC substrate pads, underfill encapsulant is used to mechanically and physically reinforce them. In a known method of underfill encapsulation, a low viscosity epoxy material is dispensed along one or two edges of an assembled package, allowing the underfill to be drawn into the gaps between the IC and the substrate by capillary action, and the underfill is subsequently cured using heat. However, this method requires separate operations to perform solder reflow, dispense the underfill, clean up any excess underfill, facilitate underfill capillary flow, and perform underfill cure, thus increasing the overall manufacturing costs. Also, with the die bump pitch and bump height decreasing and terminal count increasing, it becomes successively more difficult to obtain adequate underfill dispersion through capillary forces alone.

High performance ICs generate sufficient heat and may also be exposed to sufficient ambient heat to cause reliability problems in the form of cracked bump-to-pad connections, if the coefficient of thermal expansion (CTE) of the underfill material is significantly higher than that of silicon and/or the IC substrate material, e.g. FR-4. It is known to add certain materials, e.g. silica particles, to the underfill to lower its CTE, as well as to stiffen the underfill. However, adding particles increases the underfill viscosity, making it more difficult to apply through capillary forces.

It is known to use a no-flow underfill that is applied to the IC mounting area without using capillary forces, the underfill being subsequently cured concurrently with solder reflow, as described, for example, in U.S. Pat. No. 6,180,696. However, if sufficient particles are added to the underfill to lower its CTE, the particles tend to cause a significant interconnection yield problem, because they get interposed between the IC bumps and the substrate pads and prevent good solder joints.

For the reasons stated above, and for other reasons stated below which will become apparent to those skilled in the art upon reading and understanding the present specification, there is a significant need in the art for methods for applying underfill to component packages, such as IC packages, that minimize yield and reliability problems.

BRIEF DESCRIPTION OF THE DRAWINGS

FIG. 5 illustrates a cross-sectional representation of a portion of a component package comprising a package substrate having a component mounting area to which a filled no-flow underfill has been applied, in accordance with one embodiment of the invention;

FIG. 6 illustrates a cross-sectional representation of a component package comprising a package substrate having a component mounting area to which a component has been applied using pressure, in accordance with one embodiment of the invention;

FIG. 7 illustrates a cross-sectional representation of a completed, filled no-flow underfill component package, in accordance with one embodiment of the invention.

DETAILED DESCRIPTION OF THE EMBODIMENTS OF THE INVENTION

Figure 1:
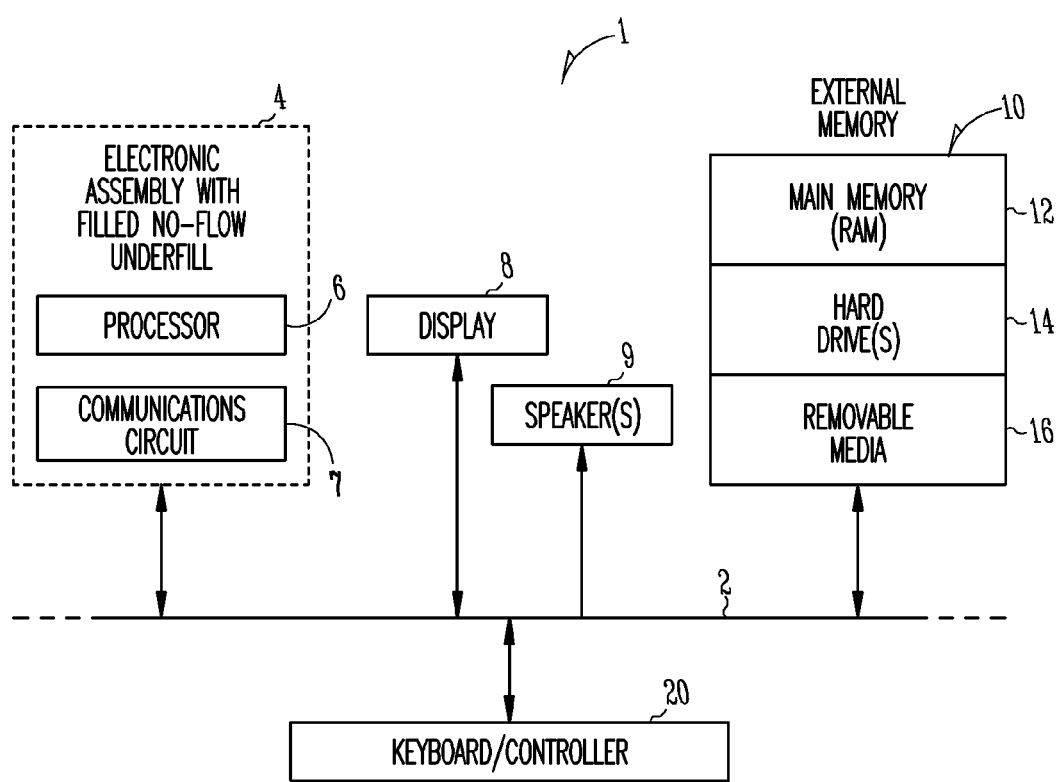
FIG. 1 is a block diagram of an electronic system incorporating at least one electronic assembly comprising a component package with a filled no-flow underfill, in accordance with one embodiment of the invention.

In the following detailed description of embodiments of the invention, reference is made to the accompanying drawings which form a part hereof, and in which is shown by way of illustration specific preferred embodiments in which the subject matter may be practiced. These embodiments are described in sufficient detail to enable those skilled in the art to practice them, and it is to be understood that other embodiments may be utilized and that structural, mechanical, compositional, procedural, and electrical changes may be made without departing from the spirit and scope of the present subject matter. Such embodiments of the inventive subject matter may be referred to, individually and/or collectively, herein by the term "invention" merely for convenience and without intending to voluntarily limit the scope of this application to any single invention or inventive concept if more than one is in fact disclosed. The following detailed description is, therefore, not to be taken in a limiting sense, and the scope of embodiments of the present invention is defined only by the appended claims.

Embodiments of the present invention provide a solution to various yield and reliability problems that are associated with prior art no-flow underfills for high performance component packages, such as IC packages, by employing a filled no-flow underfill, and by utilizing pressure to force the component bumps against the package pads to displace substantially all particles from between the component bumps and the package pads to provide good electrical contact. Various embodiments are illustrated and described herein.

In one embodiment, a no-flow underfill material is deposited in a component mounting area of a package substrate. The underfill comprises filler particles, such as silica, to lower the CTE of the cured underfill. The underfill can also include a fluxing agent, a hardening agent, a curing accelerator, a surfactant, and/or a viscosity-controlling agent. A surface of a component, containing a plurality of terminals or bumps, is aligned with a corresponding plurality of terminals or pads in the component mounting area. Suitable pressure is then applied to cause the component bumps to physically contact the substrate pads. Pressure can be applied through any suitable mechanism, including a thermocompression bonder, an ultrasonic bonder, a die placement tool, or the like. Suitable heat is then applied to reflow solder at the point of contact between the bumps and pads, and to concurrently cure the underfill. Additional heat can be applied, post reflow, if necessary to completely cure the underfill. Application of one or more of the disclosed methods to a component package, an electronic assembly, and an electronic system are also described.

"Component mounting area", as used herein, means an area on a surface of a substrate that contains mounting terminals or pads.

"Filler", as used herein with respect to underfill, means an additive to the underfill.

"No-flow", as used herein with respect to underfill, means having a viscosity suitable for the underfill to be deposited in a component mounting area of a package substrate prior to placement of a component on the package substrate.

"Suitable", as used herein, means an amount sufficient to produce the desired result(s). Suitability for the intended purpose can be determined by one of ordinary skill in the art using only routine experimentation.

FIG. 1 is a block diagram of an electronic system incorporating at least one electronic assembly comprising a component package with a filled no-flow underfill, in accordance with one embodiment of the invention. Electronic system 1 is merely one example of an electronic system in which the present subject matter can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any component package or combination of component packages. In one embodiment, electronic assembly 4 includes a component package comprising a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of component packages that can be included in electronic assembly 4 can contain one or more circuits or combination of circuits. These can include circuits like a custom circuit, an application-specific integrated circuit (ASIC), or other circuits, such as, for example, one or more circuits (such as a communications circuit 7) for use in wireless devices like cellular telephones, pagers, portable computers, two-way radios, and similar electronic systems. The component or IC can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, one or more speakers 9, and a keyboard and/or controller 20, which can include a mouse, trackball, game controller, voice-recognition device, or any other device that permits a system user to input information into and receive information from the electronic system 1.

Figure 2A:
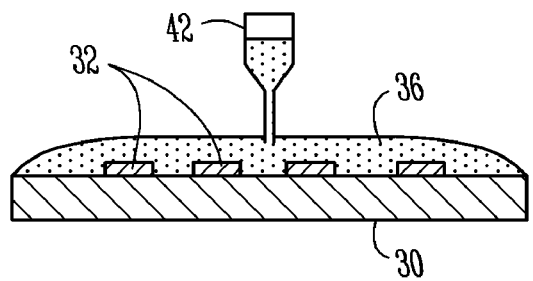
FIGS. 2A, 2B, and 2C together illustrate a prior art sequence of no-flow underfill operations.
Figure 2B:
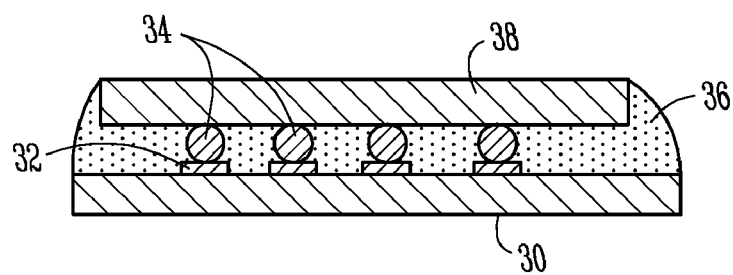
Figure 2C:
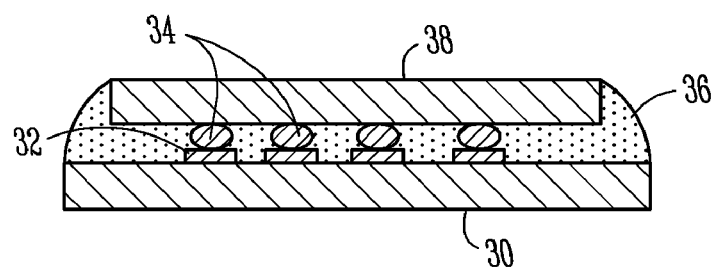

FIGS. 2A-2C together illustrate a prior art sequence of no-flow underfill operations. In FIG. 2A, a package substrate 30 has a plurality of terminals or pads 32 in an IC mounting area on an upper surface. A dispenser 42 dispenses no-flow underfill 36 over pads 32. Underfill 36 contains no filler material to control CTE. Underfill 36 has a relatively low viscosity.

Next in FIG. 2B, an IC 38 having a plurality of terminals or bumps 34 is aligned with the IC mounting area of substrate 30 and set in place. Due to the low viscosity of the underfill, the bumps 34 of IC 38 easily displace underfill 36 and physically contact corresponding pads 32. Bumps 34 and/or pads 32 have been precoated with solder paste.

Next in FIG. 2C, the package is subjected to suitable heat to produce solder reflow, melting the solder paste on bumps 34 and/or pads 32, and enabling bumps 34 and pads 32 to make good mechanical and electrical contact. The heat is also suitable to initiate, if not to complete, the hardening of underfill 36. Following reflow, additional heat can be applied, if necessary, to completely cure underfill 36.

Figure 3:
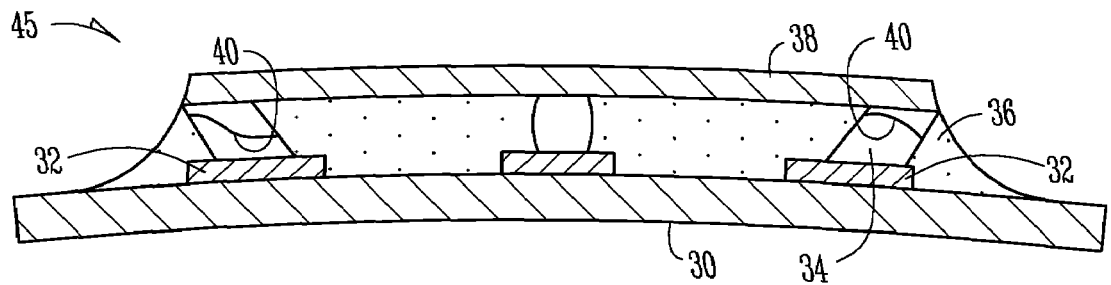
FIG. 3 is a cross-sectional representation of a prior art no-flow underfill IC package exhibiting reliability problems because of CTE mismatch between the underfill and other package constituents.

FIG. 3 is a cross-sectional representation of a prior art no-flow underfill IC package 45 exhibiting reliability problems because of CTE mismatch between the underfill and other package constituents. IC package 45 can be substantially identical to that fabricated in FIGS. 2A-2C. IC package 45 has been subjected to thermal cycling, such as burn-in cycling and/or ambient heat in a normal use environment, causing solder joints 40 to partially or totally fracture, which could cause IC package 45 to malfunction or experience catastrophic failure. This represents a significant reliability defect.

Figure 4:
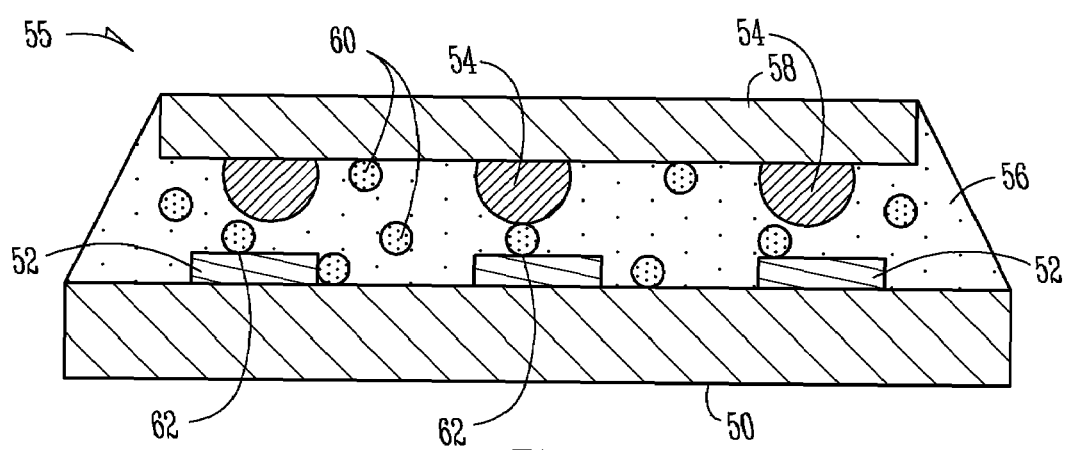
FIG. 4 is a cross-sectional representation of a prior art no-flow underfill IC package exhibiting interconnection yield problems due to the presence of particles between the IC bumps and the package pads.

FIG. 4 is a cross-sectional representation of a prior art no-flow underfill IC package 55 exhibiting interconnection yield problems due to the presence of particles 62 between the IC bumps 54 and the package pads 52. IC package 55 includes a package substrate 50 having a plurality of pads 52 in an IC mounting area on an upper surface. IC 58 comprises a plurality of bumps 54 aligned with respective pads 52.

Underfill 56 was deposited upon the IC mounting area prior to placement of IC 58 on package substrate 50. In this example, underfill 56 contains a filler material to control CTE. The filler material includes various particles 60 and 62.

Particles 62 lie between IC bumps 54 and substrate pads 52 and prevent proper physical and electrical contact between IC bumps 54 and substrate pads 52, both before and after solder reflow. For example, the presence of particles 62 between IC bumps 54 and substrate pads 52 can inhibit or completely prevent proper solder wetting during solder reflow, so that no metallurgical connection or only a poor quality metallurgical connection is made between the IC bumps 54 and the substrate pads 52. This represents a significant yield defect.

FIG. 5 illustrates a cross-sectional representation of a portion of a component package 100 comprising a package substrate 110 having a component mounting area 101 to which a filled no-flow underfill 116 has been applied, in accordance with one embodiment of the invention. Package substrate 110 has a plurality of mounting terminals or pads 112. Pads 112 can optionally be pre-coated with solder. Package substrate 110 can be a one-layer substrate or a multi-layer substrate, and it can include additional terminals (not shown) on its lower surface for mating with additional packaging structure (not shown), such as a printed circuit board (PCB) or card.

While, in FIG. 5, underfill 116 is shown deposited over a subset of pads 112, it will be understood that underfill 116 can be deposited over more or fewer pads 112, depending upon the viscosity of underfill 116, the geometry of package substrate 110, and other factors known to those of ordinary skill in the art.

Underfill 116 includes a filler having a plurality of particles 120. In an embodiment, the filler comprises an agent to reduce the CTE (coefficient of thermal expansion). The filler is selected from the group consisting of silica, silicon oxide, silicon dioxide, silicon nitride, aluminum oxide, and aluminum nitride. The filler can also be selected from the group comprising any ceramic oxide and any ceramic nitride.

The filler can be in the range of 0% to 80%, by weight, of the underfill material, depending upon the resin system selected.

By adding a suitable amount of filler, in one embodiment, the CTE of the cured underfill is lowered from approximately 80 parts-per-million (PPM)/degree Centigrade to approximately 23 PPM/degree Centigrade. Silicon (in an embodiment wherein the component is an IC) has a CTE of approximately 2.5 PPM/degree Centigrade, and FR-4 substrate material has a CTE of 18-25 PPM/degree Centigrade. Thus, cured underfill having a lowered CTE value of approximately 23 PPM/degree Centigrade has a relatively closer CTE match to the silicon chip and to an FR-4 package substrate, resulting in a package structure having greater reliability.

The filler particles 120 can have a size in the range of 0.05 microns to 40 microns.

In one embodiment, particles 120 are substantially spherical, while in other embodiments particles 120 are not spherical and are thus generally less expensive when purchased from suppliers.

In addition to being added for the purpose of reducing the CTE of the cured underfill, the filler can also serve to increase the stiffness (modulus of elasticity) of the cured underfill. The composition and amount of filler can be appropriately selected by one of ordinary skill in the art to increase the stiffness of the cured underfill.

The filler can also serve to modify the viscosity of the uncured underfill. In general, the more filler that is added to the uncured underfill, the greater the increase in the viscosity of the uncured underfill.

In one embodiment, underfill 116 comprises at least a resin and a fluxing agent. The resin can be selected from the group consisting of an epoxy resin, a siloxirane resin, a superoxirane resin, a polybenzoxazine resin, a benzocyclobutane resin, or a mixture thereof.

The fluxing agent can be selected from the group consisting of an organic carboxylic acid, a polymeric fluxing agent that has one or more carboxylic acid groups, an organic compound that contains one or more hydroxyl groups, or a mixture thereof. In general, the fluxing agent needs to remove metal oxide from the component bumps and substrate pads, and to prevent re-oxidation during high temperature operations, such as solder reflow.

The underfill can also contain other additives that provide desired characteristics, as will be understood by those of ordinary skill in the art. For example, additives can include a hardening agent and/or a curing accelerator, the choice of which depends primarily upon the composition of resin used. Some material systems do not need a hardening agent or curing accelerator, and they only require thermally curing. A surfactant can optionally be used to reduce surface tension and to improve adhesion. Fillers can also be added for purposes other than to control CTE, including to control such characteristics as viscosity, thermoconductivity, electroconductivity, and so forth. One of ordinary skill in the art can select appropriate fillers in suitable proportions to provide such characteristics.

FIG. 6 illustrates a cross-sectional representation of a component package 100 comprising a package substrate 110 having a component mounting area 101 to which a component 130 has been applied using pressure, in accordance with one embodiment of the invention. Component 130 can be of any type. In one embodiment, component 130 is an IC, such as a high performance processor chip, a high performance chip from a chip set, or other type of high performance chip.

In one embodiment, component 130 includes a plurality of terminals or bumps 132 to mount, in flip-chip orientation, to corresponding package substrate pads 112. Bumps 132 can be of any suitable material, such as lead or copper. As component 130 is aligned with the component mounting area 101 of package substrate 110, bumps 132 are aligned with corresponding pads 112.

Concurrently, or subsequently, suitable pressure is applied to component 130, to package substrate 110, or to both component 130 and package substrate 110, to cause bumps 132 to squeeze out any particles 122 that would otherwise be interposed between bumps 132 and pads 112, so that particles 122 do not remain between bumps 132 and pads 112. For example, particles 122 are shown being squeezed away from the joint between bumps 132 and pads 112 in the directions indicated by arrows 123.

It may not be essential to squeeze out every particle 122, depending upon the size and shape of particles 122. It is possible that one or more particles 122 may become embedded in one of bumps 132 and/or its corresponding pad 112 without unduly preventing adequate physical and electrical contact after solder join. However, suitable pressure is applied to cause bumps 132 to physically contact pads 112, so that during a subsequent solder reflow operation bumps 132 and pads 112 will be in adequate electrical contact.

Although in FIG. 6, pads 112 are illustrated as partially melted and as having slightly distorted upper portions that are being attracted to corresponding bumps 132 through surface tension forces, it will be understood, as described elsewhere herein, that heat need not necessarily be applied concurrently with pressure.

FIG. 7 illustrates a cross-sectional representation of a completed, filled no-flow underfill component package 100, in accordance with one embodiment of the invention. The component package 100 shown in FIG. 7 has been subjected to suitable heat to produce solder reflow, melting the solder on bumps 132 and/or pads 112, and enabling bumps 132 and pads 112 to make good mechanical and electrical contact. The heat is also suitable to initiate, if not to complete, the hardening of underfill 116. Following reflow, additional heat can be applied, if necessary, to completely cure underfill 116.

Figure 8A:
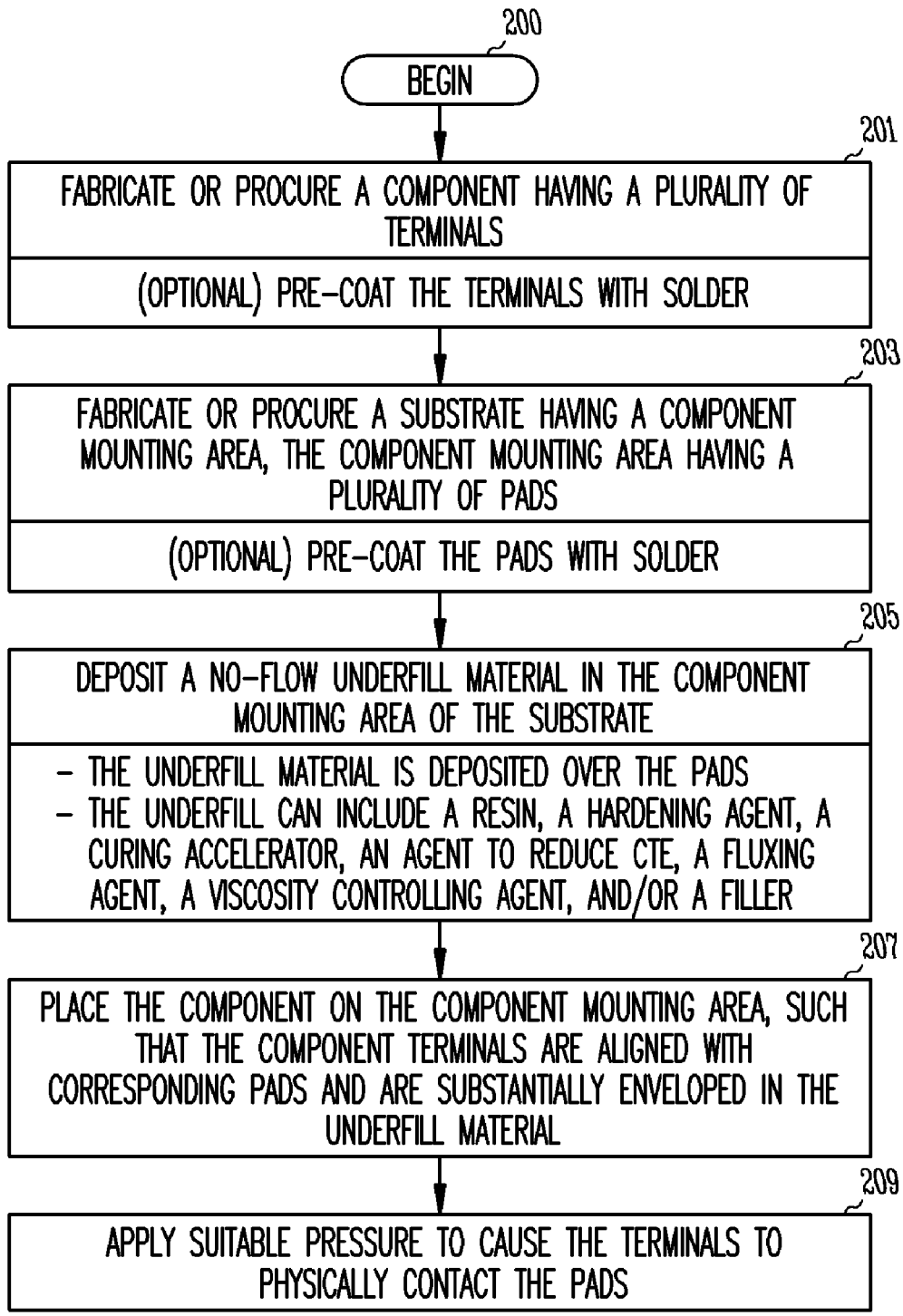
FIGS. 8A and 8B together constitute a flow diagram of a method of fabricating a component package, in accordance with one embodiment of the invention.
Figure 8B:
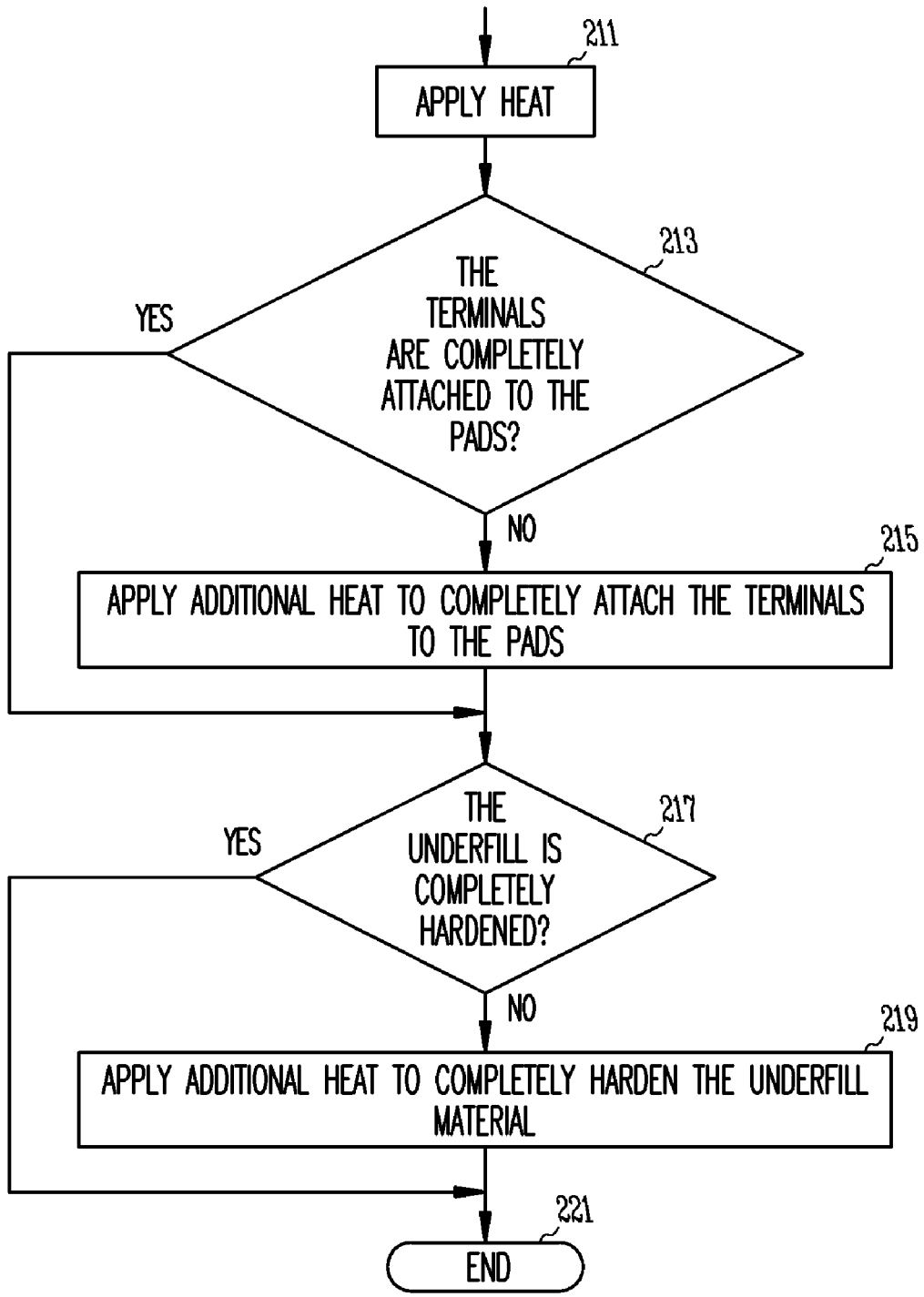

FIGS. 8A and 8B together constitute a flow diagram of a method of fabricating a component package, in accordance with one embodiment of the invention.

The method starts at 200 in FIG. 8A. In 201, a component (such as, but not limited to, an IC) is fabricated or procured. The component has a plurality of terminals or bumps. While the terminals or bumps are generally on only one surface of the component, they could possibly be on more than one surface of the component. As an optional operation, the bumps can be pre-coated with a suitable electrical adhesive, such as solder.

In 203, a substrate (such as, but not limited to, an IC package) is fabricated or procured. The substrate has a component mounting area thereon. The component mounting area has a plurality of terminals or pads. While these terminals or pads are generally on only one surface of the substrate, they could possibly be on more than one surface of the substrate. As an optional operation, the pads can be pre-coated with a suitable electrical adhesive, such as solder.

In 205, a no-flow underfill material is deposited in the component mounting area of the substrate. The underfill is deposited using any suitable mechanism. The substrate can be pre-heated if desired. The underfill is deposited over the pads, so that it substantially covers all or a subset of the pads. The underfill can include a resin, a hardening agent, a curing accelerator, an agent to reduce CTE, a fluxing agent, a viscosity-controlling agent, and/or a filler. In one embodiment, the underfill comprises at least a resin, a fluxing agent, and a filler to reduce CTE.

In 207, the component is placed on the component mounting area, such that the component terminals are aligned with corresponding pads of the component mounting area, and such that the component terminals are substantially enveloped in the underfill material. Before being picked up, the component can be heated, for example, to soaking temperature, i.e. a temperature suitable to enable a fluxing agent, assuming that one is used in the underfill, to remove metal oxide from the metal surfaces to be joined by solder. The soaking temperature can be in the range of 130-180 degrees Centigrade. Alternatively, the component can be heated to soaking temperature when heat is applied during 211.

In 209, suitable pressure is applied to cause the component terminals to physically contact the substrate pads. The suitable pressure can be applied through any suitable mechanism. In one embodiment, a thermocompression bonder is used. In another embodiment, an ultrasonic or thermosonic bonder is used. In yet another embodiment, a component placement tool is used both to align the component with the component mounting area, and to press the bumps of the component against the substrate pads. The component may be held against the substrate for a predetermined time, for example, for soaking time (i.e. a time suitable to enable a fluxing agent, assuming that one is used in the underfill, to remove metal oxide from the metal surfaces to be joined by solder).

In 211, heat is applied. Heat can be applied by different types of apparatus and in different amounts, according to a variety of different embodiments of methods for fabricating a component package.

For example, in one embodiment, suitable heat is provided in 211 by a thermocompression bonder or ultrasonic bonder to reflow solder sufficiently to bring about a high quality solder joint between the component bumps and the corresponding substrate pads. Suitable heat can also be provided by the thermocompression bonder or ultrasonic bonder to concurrently cure the underfill (completely or partially), and/or the underfill can be cured (completely or finish-cured) in a subsequent heating operation (e.g., in 219).

In another embodiment, suitable heat is provided in 211 by a thermocompression bonder or ultrasonic bonder to reflow solder sufficiently to only pre-attach the component bumps and the corresponding substrate pads (i.e. cause a partial attachment sufficient to keep the bumps attached to the pads until the assembly can be subjected to a complete solder reflow operation). Suitable heat can be provided during 211 and/or during solder reflow (e.g., in 215) to concurrently cure the underfill (completely or partially), and/or the underfill can be cured (completely or finish-cured) in a subsequent heating operation (e.g., in 215 or 219).

In yet another embodiment, suitable heat is provided in 211 by a solder reflow operation to reflow solder sufficiently to bring about a high quality solder joint betweeen the component bumps and the corresponding substrate pads. Suitable heat can be provided during solder reflow to concurrently cure the underfill (completely or partially), and/or the underfill can be cured (completely or finish-cured) in a subsequent heating operation (e.g., in 219).

In another embodiment, suitable heat is provided in 211 by a component placement tool to which a heating element or stage has been added. In this embodiment, the heat can either partially or completely produce solder joints between the component bumps and the corresponding substrate pads. Subsequent operations can be carried out, as described above, to complete the solder joints (if necessary). The underfill can be concurrently cured (completely or partially), and/or it can be cured (completely or finish-cured) in a subsequent heating operation (e.g. in 219).

In 213, if the embodiment of the method is such that, in 211, the component terminals are completely attached to the substrate pads, then the method goes to 217. Otherwise, in 215, additional heat is applied in an amount suitable to completely attach the component terminals to the substrate pads.

In 217, if the embodiment of the method is such that, in 211, the underfill is completely hardened, and the method then ends at 221. Otherwise, in 219, additional heat is applied in an amount suitable to completely harden the underfill material, and the method then ends at 221.

The operations described above with respect to the methods illustrated in FIGS. 8A and 8B can be performed in a different order from those described herein.

The above-described choice of materials; geometry; sequence of operations; equipment for applying pressure;

equipment for applying heat; and part dimensions can all be varied by one of ordinary skill in the art to optimize fabrication of component packages in accordance with the present subject matter.

Various embodiments of component packages, including IC packages, electronic assemblies, and electronic systems, including computer systems, can be implemented using various types of components, package substrates, underfill materials, various types of fabrication equipment, and various fabrication sequences, to achieve the advantages of the present disclosure.

FIGS. 1-7 are merely representational and are not drawn to scale. Certain proportions thereof may be exaggerated, while others may be minimized. FIGS. 5-8B are intended to illustrate various implementations of the disclosure that can be understood and appropriately carried out by those of ordinary skill in the art.

The present subject matter provides for methods of fabricating high-yield, high reliability, component packages, such as flip-chip IC packages, having filled, no-flow underfill. Pressure is applied via a suitable tool, such as a thermocompression bonder, ultrasonic bonder, chip placement tool, instant chip join tool, or the like, to force corresponding terminals of the component and package substrate into close physical contact, and to displace substantially all filler particles from between the component terminals and the substrate terminals to provide good electrical and mechanical contact.

The underfill comprises a filler or low CTE material to decrease CTE and increase modulus of elasticity of the cured underfill. The underfill can also comprise other additives, including a fluxing agent and/or a viscosity-controlling agent.

In one method embodiment, a thermocompression bonder or ultrasonic bonder is used to simultaneously provide solder bump reflow and underfill curing. In another method embodiment, while a component placement tool applies sufficient pressure to displace the filler particles from between the component bumps and the substrate pads, the component placement tool concurrently applies sufficient heat to pre-attach the component bumps to the substrate pads, and the component package is subsequently subjected to a suitable heat source to reflow solder at the point of contact between the bumps and pads, and to concurrently cure the underfill.

Application of various methods to a component package, an electronic assembly, and an electronic system are also described. An electronic system and/or data processing system that incorporates one or more electronic assemblies that utilize the present subject matter can be fabricated in less time and at less cost, while maintaining high yield and high reliability, and such systems are therefore more commercially attractive.

Other embodiments will be readily apparent to those of ordinary skill in the art. The elements, materials, geometries, dimensions, and sequence of operations can all be varied to suit particular packaging requirements.

While certain operations have been described herein relative to "upper" and "lower" surfaces, it will be understood that these descriptors are relative, and that they would be reversed if the component package were inverted. Therefore, these terms are not intended to be limiting.

Embodiments of the present invention are not to be construed as limited to use in ball-grid array packages, C4 (controlled collapse component connect), or any other type of component packages, and they can be used with any type of component package where the herein-described features of the present subject matter provide an advantage.

While the subject matter has been illustrated and described with regard to ICs mounted upon IC substrates, embodiments of the invention are not to be limited to such applications, and they can also be used for other types of electronic packages and other types of components, such as passive components, hybrid modules, printed circuit boards, mezzanine boards, and for any other type of electrical structure requiring underfill.

While the embodiment shown in FIGS. 5-7 has been described with reference to a single component, embodiments of the invention are not limited to packaging single components and can be used for packaging multiple components, e.g. multi-chip IC packages or multi-chip modules.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present inventive subject matter. Therefore, it is manifestly intended that embodiments of this invention be limited only by the claims and the equivalents thereof.

What is claimed is:

1. A component package fabricated by:
   depositing an underfill material over a plurality of pads in a component-mounting area of a substrate, the underfill material comprising a filler material containing particles;
   placing a component on the component-mounting area, such that terminals of the component are aligned with corresponding pads and substantially enveloped in the underfill material, the particles potentially inhibiting a suitable connection between corresponding terminals and pads unless the particles are substantially removed;
   applying suitable pressure to cause the terminals to physically contact the pads and to remove most but not all potentially inhibiting particles from between corresponding terminals and pads, with one or more particles being embedded in one of the terminals, in its corresponding pad, or in both the one terminal and its corresponding pad without preventing adequate physical and electrical contact; and
   applying suitable heat to melt solder situated between the terminals and pads, which when cooled results in an electrical and mechanical connection between corresponding terminals and pads.

2. The component package recited in claim 1 and fabricated such that the operations of applying suitable pressure and suitable heat are performed substantially concurrently by apparatus from the group comprising a thermocompression bonder, an ultrasonic bonder, and a component placement tool.

3. The component package recited in claim 1 and fabricated such that the pads are pre-coated with solder, and wherein, in applying suitable heat, the terminals become attached to the pads through the solder.

4. The component package recited in claim 1 and fabricated such that the terminals are pre-coated with solder, and wherein, in applying suitable heat, the terminals become attached to the pads through the solder.

5. The component package recited in claim 1, wherein the filler material is selected from the group consisting of silica, silicon oxide, silicon dioxide, silicon nitride, aluminum oxide, and aluminum nitride.

6. The component package recited in claim 1, wherein the underfill material further comprises a fluxing agent, and wherein, in the operation of applying suitable heat, the fluxing agent cleans the terminals and the pads.

7. An electronic assembly comprising at least one integrated circuit (IC) package fabricated by:
   depositing an underfill material over a plurality of pads in an IC mounting area of a substrate, the underfill material comprising a filler material containing particles;
   placing an IC on the IC mounting area, such that terminals of the IC are aligned with corresponding pads and substantially enveloped in the underfill material, the particles potentially inhibiting a suitable connection between corresponding terminals and pads unless the particles are substantially removed;
   applying suitable pressure to cause the terminals to physically contact the pads and to squeeze out most but not all potentially inhibiting particles from between corresponding terminals and pads, with one or more particles being embedded in one of the terminals, in its corresponding pad, or in both the one terminal and its corresponding pad without preventing adequate physical and electrical contact; and
   applying suitable heat to melt solder situated between the terminals and pads, which when cooled results in an electrical and mechanical connection between corresponding terminals and pads.

8. The electronic assembly recited in claim 7 and fabricated such that the operations of applying suitable pressure and suitable heat are performed substantially concurrently by apparatus from the group comprising a thermocompression bonder, an ultrasonic bonder, and a component placement tool.

9. The electronic assembly recited in claim 7, wherein the underfill material comprises a filler material selected from the group consisting of silica, silicon oxide, silicon dioxide, silicon nitride, aluminum oxide, and aluminum nitride.

10. The electronic assembly recited in claim 7, wherein the underfill material further comprises a fluxing agent, and wherein, in the operation of applying suitable heat, the fluxing agent cleans the terminals and the pads.

* * * * *